United States Patent
Chun (10) Patent No.: US 10,559,701 B2
(45) Date of Patent: Feb. 11, 2020

(54) SEMICONDUCTOR DEVICE AND METHOD OF MANUFACTURING THE SAME

(71) Applicants: Hyundai Motor Company, Seoul (KR); Kia Motors Corporation, Seoul (KR)

(72) Inventor: Dae Hwan Chun, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/172,647

(22) Filed: Oct. 26, 2018

(65) Prior Publication Data
US 2019/0334036 A1    Oct. 31, 2019

(30) Foreign Application Priority Data
Apr. 27, 2018  (KR) .................... 10-2018-0048923

(51) Int. Cl.
| | | |
|---|---|---|
| H01L 29/808 | (2006.01) | |
| H01L 29/10 | (2006.01) | |
| H01L 29/66 | (2006.01) | |
| H01L 29/06 | (2006.01) | |
| H01L 29/16 | (2006.01) | |
| H01L 29/08 | (2006.01) | |
| H01L 29/36 | (2006.01) | |

(52) U.S. Cl.
CPC ...... *H01L 29/8083* (2013.01); *H01L 29/0615* (2013.01); *H01L 29/0843* (2013.01); *H01L 29/1058* (2013.01); *H01L 29/1066* (2013.01); *H01L 29/1608* (2013.01); *H01L 29/66068* (2013.01); *H01L 29/66909* (2013.01); *H01L 29/36* (2013.01); *H01L 29/66893* (2013.01)

(58) Field of Classification Search
None
See application file for complete search history.

(56) References Cited

U.S. PATENT DOCUMENTS

| | | | | |
|---|---|---|---|---|
| 6,057,558 A | * | 5/2000 | Yamamoto | H01L 29/0847 257/77 |
| 6,969,887 B2 | * | 11/2005 | Mizukami | H01L 29/0623 257/330 |

(Continued)

FOREIGN PATENT DOCUMENTS

| | | |
|---|---|---|
| JP | 3952814 B2 | 8/2007 |
| JP | 6077385 B2 | 2/2017 |

*Primary Examiner* — Andres Munoz
(74) *Attorney, Agent, or Firm* — Mintz Levin Cohn Ferris Glovsky and Popeo, P.C.; Peter F. Corless (57) ABSTRACT

A semiconductor device is provide. The device includes a first n− type of layer, a second n− type of layer, and an n+ type of region sequentially disposed on a first surface of a substrate. A trench is disposed on a side surface of the second n− type of layer, a p type of region is disposed between the second n− type of layer and the trench, and a gate electrode is disposed on a bottom surface of the trench. A source electrode is disposed on the n+ type of region and a drain electrode is disposed on a second surface of the substrate. The second n− type of layer includes a first concentration layer, a second concentration layer, a third concentration layer, and a fourth concentration layer sequentially disposed on the first n− type of layer.

15 Claims, 10 Drawing Sheets

(56) References Cited

U.S. PATENT DOCUMENTS

| | | | |
|---|---|---|---|
| 2002/0190258 A1* | 12/2002 | Harada | H01L 29/7722 257/77 |
| 2006/0199312 A1* | 9/2006 | Harris | H01L 29/1066 438/133 |
| 2007/0096145 A1* | 5/2007 | Watanabe | H01L 29/0692 257/134 |
| 2010/0320476 A1* | 12/2010 | Cheng | H01L 29/8083 257/77 |
| 2016/0380117 A1* | 12/2016 | Bhalla | H01L 29/1608 257/77 |
| 2017/0222046 A1* | 8/2017 | Wakimoto | H01L 29/7827 |

* cited by examiner

SEMICONDUCTOR DEVICE AND METHOD OF MANUFACTURING THE SAME

CROSS-REFERENCE TO RELATED APPLICATION

This application claims priority to and the benefit of Korean Patent Application No. 10-2018-0048923 filed on Apr. 27, 2018, the entire contents of which are incorporated herein by reference.

BACKGROUND (a) Technical Field

The present invention relates to a semiconductor device and a manufacturing method thereof, and more particularly, to a semiconductor device that decreases an on resistance and improves a current density in a junction field effect transistor (JFET).

(b) Description of the Related Art

A power semiconductor device is particularly required to have low turn-on resistance or a low saturated voltage to reduce power loss in a conductive state while a substantial amount of current flows. Further, the power semiconductor device is required to have a characteristic of enduring an inverse directional high voltage, which may be applied to opposite terminals of the power semiconductor device when it is turned off or when a switch is turned off, that is, to have a high breakdown voltage characteristic.

As the power semiconductor device, there are a metal oxide semiconductor field effect transistor (MOSFET), a junction field effect transistor (JFET), etc. Among them, since the JFET controls a channel region by a depletion layer in the PN junction, a process of forming a gate insulating layer is not required, unlike the MOSFET. Therefore, the process of the JFET is simpler compared with the MOSFET.

The above information disclosed in this section is merely for enhancement of understanding of the background of the invention and therefore it may contain information that does not form the prior art that is already known in this country to a person of ordinary skill in the art.

SUMMARY

The present invention provides a semiconductor device and a manufacturing method thereof that decrease an on resistance and improve a current density in the JFET.

A semiconductor device according to an exemplary embodiment of the present invention may include: a first n− type of layer, a second n− type of layer, and an n+ type of region sequentially disposed on a first surface of a substrate; a trench disposed on a side surface of the second n− type of layer; a p type of region disposed between the second n− type of layer and the trench; a gate electrode disposed on a bottom surface of the trench; a source electrode disposed on the n+ type of region; and a drain electrode disposed on a second surface of the substrate. The second n− type of layer may include a first concentration layer, a second concentration layer, a third concentration layer, and a fourth concentration layer sequentially disposed on the first n− type of layer. An ion doping concentration of the second concentration layer may be lower than the ion doping concentration of the first concentration layer, an ion doping concentration of the third concentration layer may be lower than the ion doping concentration of the second concentration layer, and an ion doping concentration of the fourth concentration layer may be lower than the ion doping concentration of the third concentration layer.

A channel region may be formed in the second n− type of layer. The p type of region may extend from the side surface of the trench below the bottom surface of the trench. The semiconductor device according to an exemplary embodiment of the present invention may further include a p+ type of region disposed between the bottom surface of the trench and the p type of region. The ion doping concentration of the first concentration layer may be lower than the ion doping concentration of the first n− type of layer. The ion doping concentration of the first concentration layer may be higher than the ion doping concentration of the first n− type of layer.

One among the fourth concentration layer, the third concentration layer, and the second concentration layer may have an ion doping concentration that is equal to or lower than the ion doping concentration of the first n− type of layer. The substrate may be an n+ type of silicon carbide substrate.

A manufacturing method of a semiconductor device according to an exemplary embodiment of the present invention may include: forming a first n− type of layer on a first surface of a substrate; forming a second n− type of layer on the first n− type of layer; forming an n+ type of region on the second n− type of layer; etching the n+ type of region and the second n− type of layer to form a trench; forming a p type of region close to the side surface of the trench and extending to the bottom surface of the trench; forming a gate electrode on the bottom surface of the trench; forming a source electrode on the n+ type of region; and forming a drain electrode on the second surface of the substrate. The forming of the second n− type of layer may include sequentially forming a first concentration layer, a second concentration layer, a third concentration layer, and a fourth concentration layer on the first n− type of layer. The ion doping concentration of the second concentration layer may be lower than the ion doping concentration of the first concentration layer, the ion doping concentration of the third concentration layer may be lower than the ion doping concentration of the second concentration layer, and the ion doping concentration of the fourth concentration layer may be lower than the ion doping concentration of the third concentration layer.

According to an exemplary embodiment of the present invention, as an acceleration electric field is formed in the channel region, on resistance of the semiconductor device may be reduced and current density may be improved. Accordingly, an electrically conductive area of the semiconductor device may be reduced to increase a yield of the semiconductor device and reduce an overall cost.

BRIEF DESCRIPTION OF THE DRAWINGS

The objects, features and advantages of the present invention will be more apparent from the following detailed description in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter, exemplary embodiments of the present invention will be described in detail with reference to the accompanying drawings. As those skilled in the art would realize, the described exemplary embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening elements may also be present.

Figure 1:
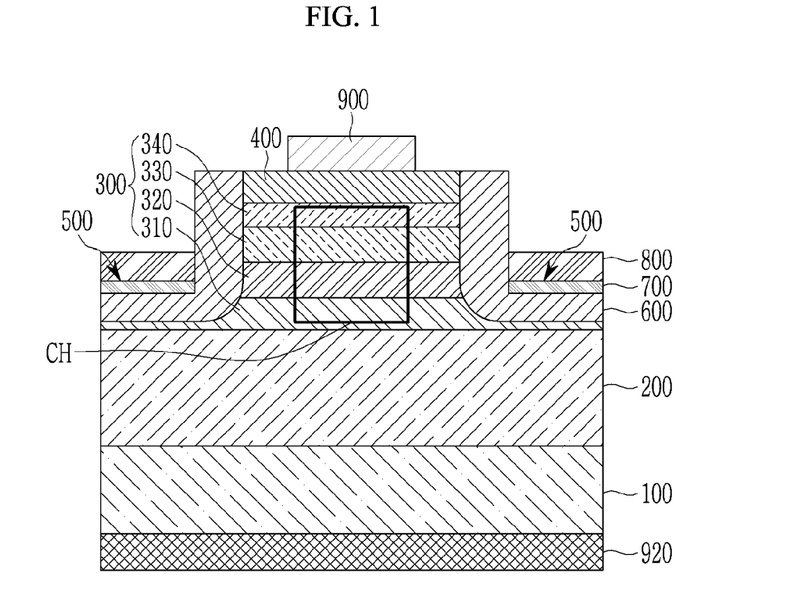
FIG. 1 is a view schematically showing a cross-section of a semiconductor device according to an exemplary embodiment of the present invention.

FIG. 1 is a view schematically showing a cross-section of a semiconductor device according to an exemplary embodiment of the present invention. Referring to FIG. 1, the semiconductor device according to the present exemplary embodiment may include a substrate 100, a first n− type of layer 200, a second n− type of layer 300, an n+ type of region 400, a trench 500, a p type of region 600, a p+ type of region 700, a gate electrode 800, a source electrode 900, and a drain electrode 920.

The substrate 100 may be an n+ type of silicon carbide substrate. The first n− type of layer 200, the second n− type of layer 300, and the n+ type of region 400 may be sequentially disposed on the first surface of the substrate 100. The p type of region 600 may be disposed on the side surface of the second n− type of layer 300. The trench 500 may be positioned on the side surface of the p type of region 600. The p type of region 600 may be disposed proximate to the side surface of the trench 500 and may extend under the bottom surface of the trench 500. The p type of region 600 may be disposed to abut the side surface of the trench 500. The p+ type of region 700 may be disposed between the bottom surface of the trench 500 and the p type of region 600.

Additionally, the gate electrode 800 may be disposed at the bottom surface of the trench 500. The gate electrode 800 may overlap the p+ type of region 700 on the bottom surface of the trench 500, and may abut the p type of region 600 at the side surface of the trench 500. The gate electrode 800 may include polycrystalline silicone or a metal. The source electrode 900 may be disposed on the n+ type of region 400, and the drain electrode 920 may be disposed on the second surface of the substrate 100. In particular, the source electrode 900 and the drain electrode 920 may include an ohmic metal. The second surface of the n+ type of silicon carbide substrate 100 indicates a surface opposite to the first surface of the substrate 100.

A channel region CH of the semiconductor device may be formed in the second n− type of layer 300 disposed at the side surface of the p type of region 600 and under the n+ type of region 400. The second n− type of layer 300 may include a first concentration layer 310, a second concentration layer 320, a third concentration layer 330, and a fourth concentration layer 340. The first concentration layer 310, the second concentration layer 320, the third concentration layer 330, and the fourth concentration layer 340 may be sequentially disposed on the first n− type of layer 200. In other words, the bottom surface of the first concentration layer 310 may be in contact with (e.g., abut) the first n− type of layer 200, and the upper surface of the fourth concentration layer 340 may be in contact with (e.g., abut) the n+ type of region 400.

An ion doping concentration of the first concentration layer 310 may be lower than an ion doping concentration of the first n− type of layer 200, and an ion doping concentration of the second concentration layer 320 may be lower than the ion doping concentration of the first concentration layer 310. An ion doping concentration of the third concentration layer 330 may be lower than the ion doping concentration of the second concentration layer 320, and an ion doping concentration of the fourth concentration layer 340 may be lower than the ion doping concentration of the third concentration layer 330. In other words, the ion doping concentration of the fourth concentration layer 340, the third concentration layer 330, the second concentration layer 320, the first concentration layer 310, and the first n− type of layer 200 may increase in the direction from the source electrode 900 to the drain electrode 920. The second n− type of layer 300 may include four concentration layers, however it is not limited thereto, and four or more concentration layers or four or more concentration layers may be included.

An acceleration electric field in which a flow of an electron current is accelerated may be generated in the channel region CH by a gradient of the ion doping concentration. The acceleration electric field may be formed at a position where the ion doping concentration is changed, that is, a position where the fourth concentration layer 340 and the third concentration layer 330 are in contact, a position where the third concentration layer 330 and the second concentration layer 320 are in contact, a position where the second concentration layer 320 and the first concentration layer 310 are in contact, and a position where the first concentration layer 310 and the first n− type of layer 200 are in contact.

As above-described, as the acceleration electric field may be formed in the channel region CH, the on resistance of the semiconductor device may be decreased and the current density may be improved. Since the current density of the semiconductor device may be improved, an electrically conductive area of the semiconductor device may be reduced, and accordingly, a yield of the semiconductor device may be increased and a cost may be reduced.

Figure 2:
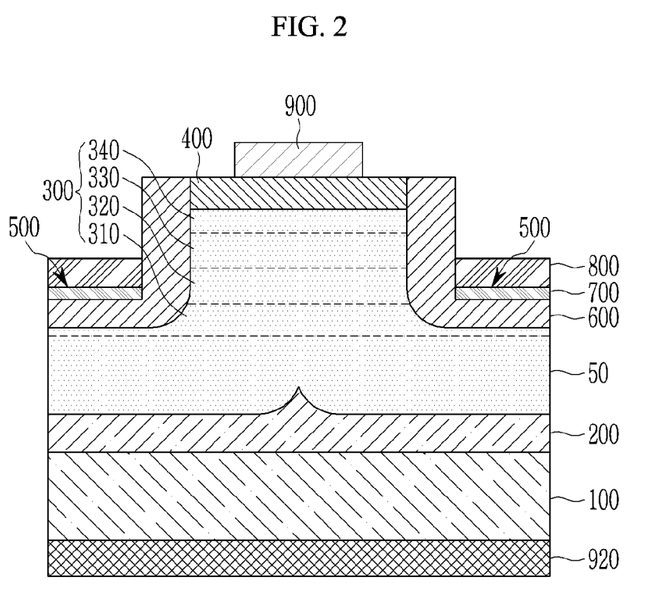
FIG. 2 is a view schematically showing an off state of the semiconductor device shown in FIG. 1 according to an exemplary embodiment of the present invention.
Figure 3:
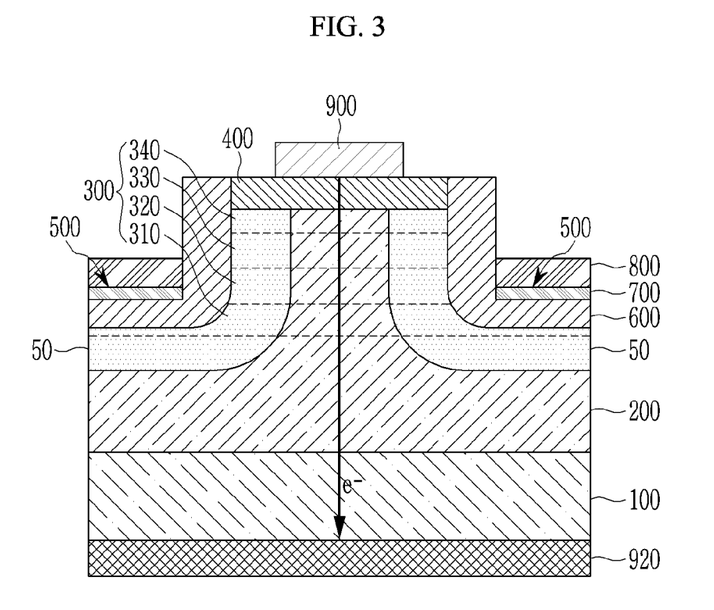
FIG. 3 is a view schematically showing an on state of the semiconductor device shown in FIG. 1 according to an exemplary embodiment of the present invention.

Furthermore, an operation of the semiconductor device according to FIG. 1 is described with reference to FIG. 2 and FIG. 3. FIG. 2 and FIG. 3 are views schematically showing the operation of the semiconductor device according to FIG. 1. FIG. 2 is a view schematically showing an off state of the semiconductor device shown in FIG. 1. FIG. 3 is a view schematically showing an on state of the semiconductor device shown in FIG. 1.

The off state of the semiconductor device is satisfied in a condition below.

$$V_{GS} < V_{TH}, V_{DS} \geq 0V$$

The on state of the semiconductor device is satisfied in a condition below.

$$V_{bi} \geq V_{GS} \geq V_{TH}, V_{DS} > 0V$$

wherein, $V_{TH}$ is a threshold voltage of a MOSFET, $V_{GS}$ is $V_G-V_S$, and $V_{DS}$ is $V_D-V_S$. $V_G$ is a voltage applied to the gate electrode, $V_D$ is a voltage applied to the drain electrode, and $V_S$ is a voltage applied to the source electrode. $V_{bi}$ as a voltage at which a PN junction is turned on is a built-in voltage between the p type of region 600, and the first n− type of layer 200 and the second n− type of layer 300.

Referring to FIG. 2, at the time of the off state of the semiconductor device, a depletion layer 50 may be formed in a part of the second n− type of layer 300 and the first n− type of layer 200 to prevent the flow of the electrons and the current. The depletion layer 50 may be formed due to the PN junction between the p type of region 600, and the second n− type of layer 300 and the first n− type of layer 200.

Referring to FIG. 3, at the time of the on state of the semiconductor device, the area of the depletion layer 50 may be reduced. The depletion layer 50 may be disposed to abut the p type of region 600, and the channel region of the semiconductor may be formed in the second n− type of layer 300 in which the depletion layer 50 is removed, and thus, a current path may be formed. In particular, as the acceleration electric field is formed in the channel region, that is, the second n− type of layer 300, the flow of the electron current may be accelerated, and accordingly, the on resistance of the semiconductor device may be decreased and the current density may be improved.

Moreover, characteristics of the semiconductor device according to the present exemplary embodiment and a conventional semiconductor device are described with reference to Table 1. Table 1 shows a simulation result of the semiconductor device according to the present exemplary embodiment and a conventional semiconductor device. A comparative example is a conventional JFET element in which the acceleration electric field does not exist in the channel region. An exemplary embodiment is the semiconductor device according to FIG. 1.

In Table 1, the characteristics are compared with almost equal threshold voltages of the semiconductor device according to the exemplary embodiment and the semiconductor device according to the comparative example.

TABLE 1

|  | Threshold voltage (V) | On resistance (mΩ · cm2) | Current density (A/cm$^2$) |
| --- | --- | --- | --- |
| Comparative example | 1.69 | 15.2 | 168 |
| Exemplary embodiment | 1.67 | 12.5 | 193 |

Referring to Table 1, the on resistance appears as 15.2 mΩ·cm$^2$ in the semiconductor device according to the comparative example, and the on resistance appears as 12.5 mΩ·cm$^2$ in the semiconductor device according to the exemplary embodiment. In other words, it may be confirmed that the on resistance of the semiconductor device according to the exemplary embodiment is reduced by 18% compared with the on resistance of the semiconductor device according to the comparative example.

Additionally, the current density appears as 168 A/cm$^2$ in the semiconductor device according to the comparative example, and the current density appears as 193 A/cm$^2$ in the semiconductor device according to the exemplary embodiment. In other words, it may be confirmed that the current density of the semiconductor device according to the exemplary embodiment is reduced by 15% compared with the current density of the semiconductor device according to the comparative example.

Figure 4:
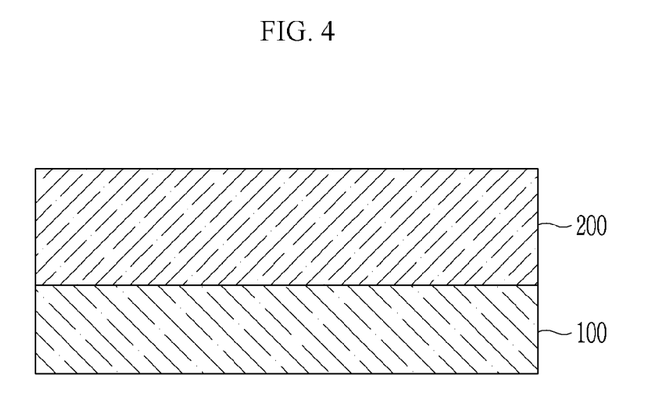
FIG. 4 to FIG. 9 are views schematically showing a manufacturing method of the semiconductor device shown in FIG. 1 according to an exemplary embodiment of the present invention.

The manufacturing method of the semiconductor device of FIG. 1 will be described with reference to FIG. 4 to FIG. 9, and FIG. 1. FIG. 4 to FIG. 9 are views schematically showing a manufacturing method of the semiconductor device shown in FIG. 1. Referring to FIG. 4, an n type of substrate 100 may be prepared, and a first n− type of layer 200 may be formed in the first surface of the substrate 100. The first n− type of layer 200 may be formed by epitaxial growth on the first surface of the substrate 100. In particular, the substrate 100 may be an n+ type of silicon carbide substrate.

Figure 5:
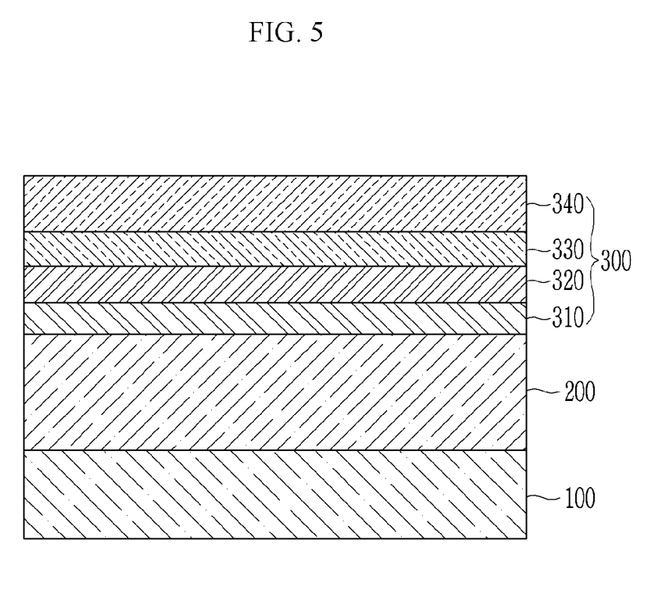

Referring to FIG. 5, a first concentration layer 310, a second concentration layer 320, a third concentration layer 330, and a fourth concentration layer 340 may be sequentially formed on the first n− type of layer 200 to form a second n− type of layer 300. Particularly, the first concentration layer 310, the second concentration layer 320, the third concentration layer 330, and the fourth concentration layer 340 may be formed by epitaxial growth. In other words, the first concentration layer 310 may be formed on the first n− type of layer 200 by epitaxial growth, the second concentration layer 320 may be formed on the first concentration layer 310 by epitaxial growth, the third concentration layer 330 may be formed on the second concentration layer 320 by epitaxial growth, and the fourth concentration layer 340 may be formed on the third concentration layer 330 by epitaxial growth.

The ion doping concentration of the first concentration layer 310 may be lower than the ion doping concentration of the first n− type of layer 200, and the ion doping concentration of the second concentration layer 320 may be lower than the ion doping concentration of the first concentration layer 310. The ion doping concentration of the third concentration layer 330 may be lower than the ion doping concentration of the second concentration layer 320, and the ion doping concentration of the fourth concentration layer 340 may be lower than the ion doping concentration of the third concentration layer 330.

Figure 6:
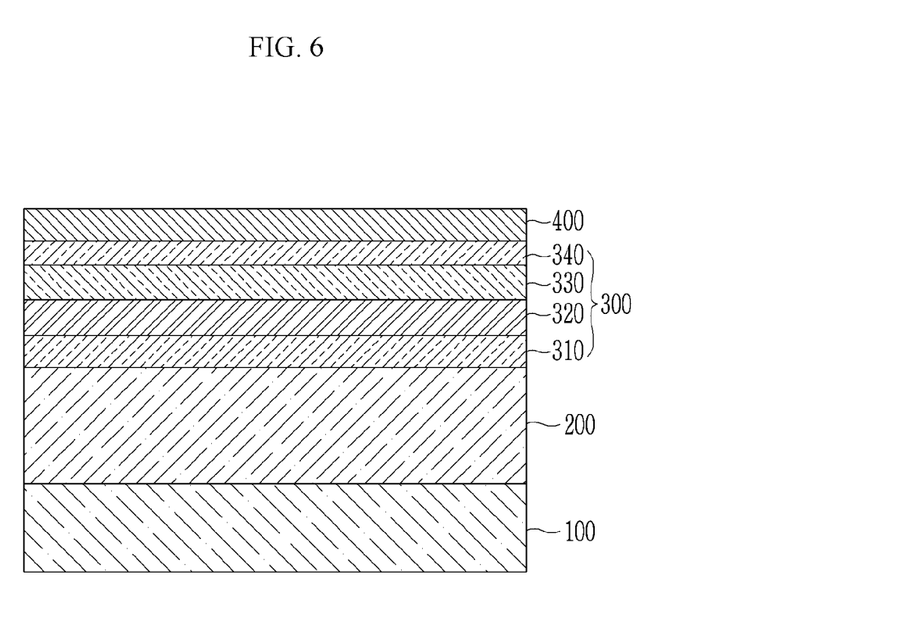

Referring to FIG. 6, an n+ type of region 400 may be formed by injecting an n type of ion such as nitrogen (N), phosphorus (P), arsenic (As), and antimony (Sb) to the fourth concentration layer 340. The ion doping concentration of the n+ type of region 400 may be higher than the ion doping concentration of the first n− type of layer 200.

Figure 7:
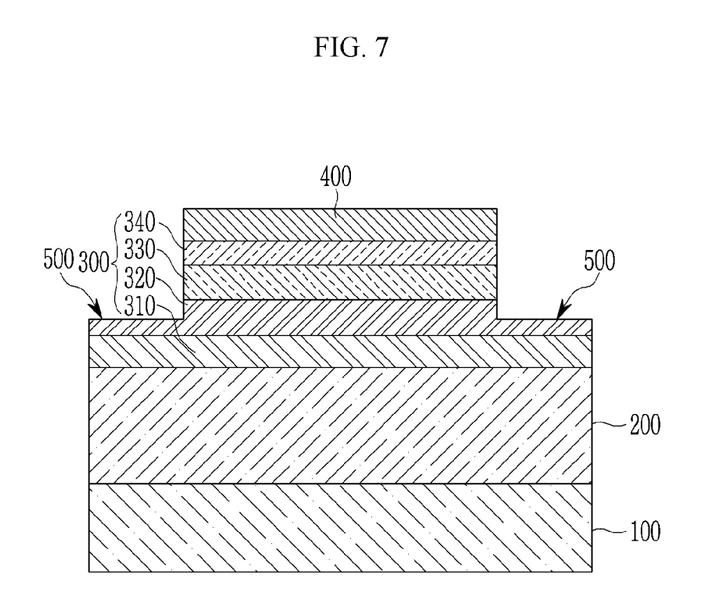
Figure 8:
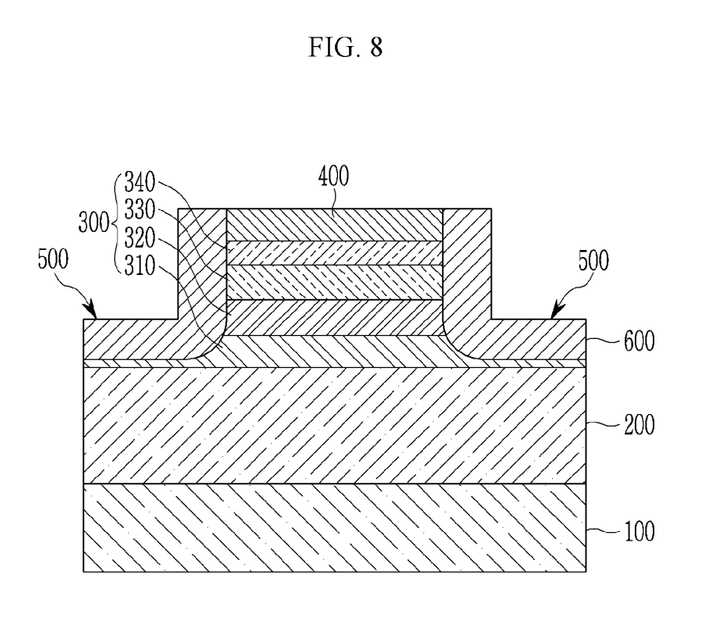

Referring to FIG. 7, the n+ type of region 400 and the second n− type of layer 300 may be etched to form a trench 500. Referring to FIG. 8, a p type of region 600 may be formed by injecting a p type of ion such as boron (B), aluminum (Al), gallium (Ga), and indium (In) to the side surface and the bottom surface of the trench 500. Thus, the p type of region 600 may be disposed proximate to the side surface of the trench 500 and may extend below the bottom surface of the trench 500.

Figure 9:
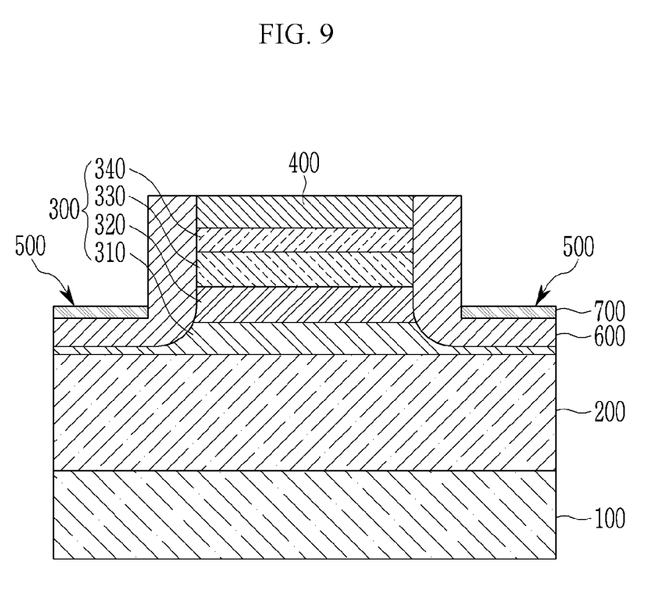

Referring to FIG. 9, a p+ type of region 700 may be formed by injecting a p type of ion such as boron (B), aluminum (Al), gallium (Ga), and indium (In) to the p type of region 600 disposed under the bottom surface of the trench 500. Accordingly, the p+ type of region 700 may be formed at the bottom surface of the trench 500. The ion doping concentration of the p+ type of region 700 may be higher than the ion doping concentration of the p type of region 600. Referring to FIG. 1, a gate electrode 800 may be formed on the bottom surface of the trench 500, a source electrode 900 may be formed on the n+ type of region 400, and a drain electrode 920 is formed on the second surface of the substrate 100.

Figure 10:
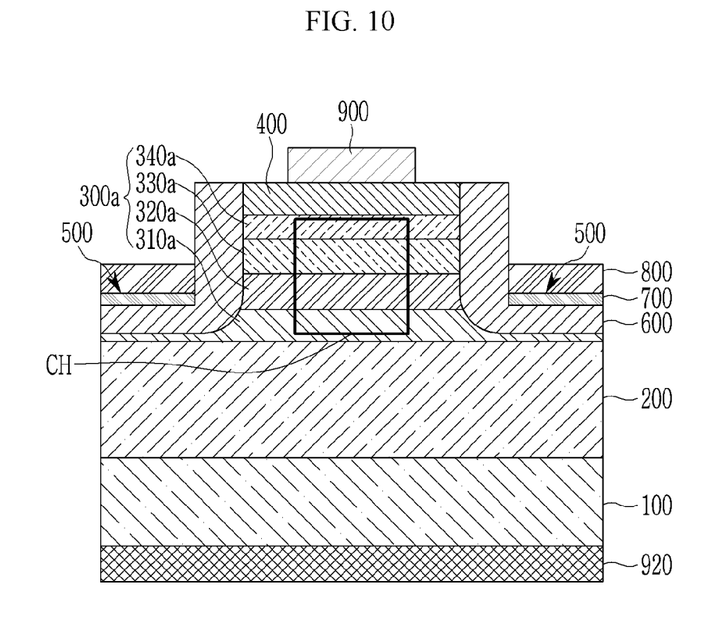
FIG. 10 is a view schematically showing an example of a cross-section of a semiconductor device according to another exemplary embodiment of the present invention.

Further, the semiconductor device according to another exemplary embodiment of the present invention is described with reference to FIG. 10. FIG. 10 is a view schematically showing a cross-section of a semiconductor device according to another exemplary embodiment of the present invention. Referring to FIG. 10, the rest of the structure except for the second n− type of layer is the same as that of the semiconductor device of FIG. 1. Therefore, the description for the same structure is omitted.

A second n− type of layer 300a may be disposed on the first n− type of layer 200. The n+ type of region 400 may be disposed on the second n− type of layer 300a. The second n− type of layer 300a may include a first concentration layer 310a, a second concentration layer 320a, a third concentration layer 330a, a the fourth concentration layer 340a. The first concentration layer 310a, the second concentration layer 320a, the third concentration layer 330a, and the fourth concentration layer 340a may be sequentially disposed on the first n− type of layer 200. In other words, the bottom surface of the first concentration layer 310a may be in contact with (e.g., abut) the first n− type of layer 200, and the top surface of the fourth concentration layer 340a may be in contact with (e.g., abut) the n+ type of region 400.

The ion doping concentration of the first concentration layer 310a may be higher than the ion doping concentration of the first n− type of layer 200, and the ion doping concentration of the second concentration layer 320a may be lower than the ion doping concentration of the first concentration layer 310a. The ion doping concentration of the third concentration layer 330a may be lower than the ion doping concentration of the second concentration layer 320a, and the ion doping concentration of the fourth concentration layer 340a may be lower than the ion doping concentration of the third concentration layer 330a. In other words, the ion doping concentration of the fourth concentration layer 340a, the third concentration layer 330a, the second concentration layer 320a, and the first concentration layer 310a may be increased in the direction from the source electrode 900 to the drain electrode 920. In particular, one among the fourth concentration layer 340a, the third concentration layer 330a, and the second concentration layer 320a may have the ion doping concentration that is equal to or lower than the ion doping concentration of the first n− type of layer 200.

In the present exemplary embodiment, the second n− type of layer 300a may include four concentration layers, however it is not limited thereto, and four or more concentration layers may be included. Additionally, the acceleration electric field in which the flow of an electron current is accelerated may be generated in the channel region CH by a gradient of this ion doping concentration. The acceleration electric field may be formed at the position where the ion doping concentration is changed, that is, the position where the fourth concentration layer 340a and the third concentration layer 330a are in contact, the position where the third concentration layer 330a and the second concentration layer 320a are in contact, and the position where the second concentration layer 320a and the first concentration layer 310a are in contact. The first concentration layer 310a having the higher ion doping concentration than the ion doping concentration of the first n− type of layer 200 also contribute to the dispersing of the flow of the electron current.

While this invention has been described in connection with what is presently considered to be exemplary embodiments, it is to be understood that the invention is not limited to the disclosed exemplary embodiments, but, on the contrary, is intended to cover various modifications and equivalent arrangements included within the spirit and scope of the appended claims.

DESCRIPTION OF SYMBOLS

100: substrate
200: n− type of layer
300, 300a: second n− type of layer
310, 310a: first concentration layer
320, 320a: second concentration layer
330, 330a: third concentration layer
340, 340a: fourth concentration layer
400: n+ type of region
500: trench
600: p type of region
700: p+ type of region
800: gate electrode
900: source electrode
920: drain electrode

What is claimed is:
1. A semiconductor device, comprising:
   a first n− type of layer, a second n− type of layer, and an n+ type of region sequentially disposed on a first surface of a substrate;
   a trench disposed on a side surface of the second n− type of layer;
   a p type of region disposed between the second n− type of layer and the trench;
   a gate electrode disposed on a bottom surface of the trench;
   a source electrode disposed on the n+ type of region; and
   a drain electrode disposed on a second surface of the substrate,
   wherein the second n− type of layer includes a first concentration layer, a second concentration layer, a third concentration layer, and a fourth concentration layer sequentially disposed on the first n− type of layer, wherein an ion doping concentration of the second concentration layer is lower than an ion doping concentration of the first concentration layer, wherein an ion doping concentration of the third concentration layer is lower than the ion doping concentration of the second concentration layer, and wherein an ion doping concentration of the fourth concentration layer is lower than the ion doping concentration of the third concentration layer.

2. The semiconductor device of claim 1, wherein a channel region is formed in the second n− type of layer.

3. The semiconductor device of claim 2, wherein the p type of region extends from a side surface of the trench to below the bottom surface of the trench.

4. The semiconductor device of claim 3, further comprising:
   a p+ type of region disposed between the bottom surface of the trench and the p type of region.

5. The semiconductor device of claim 4, wherein the ion doping concentration of the first concentration layer is lower than an ion doping concentration of the first n− type of layer.

6. The semiconductor device of claim 4, wherein the ion doping concentration of the first concentration layer is higher than an ion doping concentration of the first n− type of layer.

7. The semiconductor device of claim 6, wherein one among the fourth concentration layer, the third concentration layer, and the second concentration layer has an ion doping concentration that is equal to or lower than the ion doping concentration of the first n− type of layer.

8. The semiconductor device of claim 1, wherein the substrate is an n+ type of silicon carbide substrate.

9. A method for manufacturing a semiconductor device, comprising:
   forming a first n− type of layer on a first surface of a substrate;
   forming a second n− type of layer on the first n− type of layer;
   forming an n+ type of region on the second n− type of layer;
   etching the n+ type of region and the second n− type of layer to form a trench;
   forming a p type of region close to a side surface of the trench and extending to the bottom surface of the trench;
   forming a gate electrode on the bottom surface of the trench;
   forming a source electrode on the n+ type of region; and
   forming a drain electrode on a second surface of the substrate,
   wherein the forming of the second n− type of layer includes sequentially forming a first concentration layer, a second concentration layer, a third concentration layer, and a fourth concentration layer on the first n− type of layer,
   wherein an ion doping concentration of the second concentration layer is lower than an ion doping concentration of the first concentration layer,
   wherein an ion doping concentration of the third concentration layer is lower than the ion doping concentration of the second concentration layer, and
   wherein an ion doping concentration of the fourth concentration layer is lower than the ion doping concentration of the third concentration layer.

10. The method of claim 9, wherein a channel region is formed in the second n− type of layer.

11. The method of claim 10, further comprising:
    forming a p+ type of region disposed between the bottom surface of the trench and the p type of region.

12. The method of claim 11, wherein the ion doping concentration of the first concentration layer is lower than an ion doping concentration of the first n− type of layer.

13. The method of claim 11, wherein the ion doping concentration of the first concentration layer is higher than an ion doping concentration of the first n− type of layer.

14. The method of claim 13, wherein one of the fourth concentration layer, the third concentration layer, and the second concentration layer has an ion doping concentration that is equal to or lower than the ion doping concentration of the first n− type of layer.

15. The method of claim 9, wherein the substrate is an n+ type of silicon carbide substrate.

* * * * *